(12) United States Patent
Risbo et al.

(10) Patent No.: US 10,397,701 B2
(45) Date of Patent: *Aug. 27, 2019

(54) DIRECT CURRENT MODE DIGITAL-TO-ANALOG CONVERTER TO CLASS D AMPLIFIER

(71) Applicant: TEXAS INSTRUMENTS INCORPORATED, Dallas, TX (US)

(72) Inventors: Lars Risbo, Hvalsoe (DK); Ryan Erik Lind, Knoxville, TN (US); Jasjot Singh Chadha, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/175,907

(22) Filed: Oct. 31, 2018

(65) Prior Publication Data
US 2019/0069087 A1    Feb. 28, 2019

Related U.S. Application Data

(63) Continuation of application No. 15/897,177, filed on Feb. 15, 2018, now Pat. No. 10,158,942, which is a (Continued)

(51) Int. Cl.
*H04R 3/00* (2006.01)
*H04R 3/02* (2006.01)
(Continued)

(52) U.S. Cl.
CPC .............. *H04R 3/02* (2013.01); *H03F 3/185* (2013.01); *H03F 3/2173* (2013.01); (Continued)

(58) Field of Classification Search
CPC .. H04R 3/02; H04R 3/00; H03F 3/185; H03F 3/2173; H03F 3/3022; H03F 3/45192; H03F 2200/03; H03F 2200/351; H03F 2200/411
(Continued)

(56) References Cited

U.S. PATENT DOCUMENTS 4,592,087 A  *  5/1986  Killion .................. H03F 3/2171
                                                             330/251
2006/0028272 A1 *  2/2006  Ozawa ..................... H03F 3/217
                                                             330/251
(Continued)

*Primary Examiner* — Vivian C Chin
*Assistant Examiner* — Con P Tran
(74) *Attorney, Agent, or Firm* — John R. Pessetto; Charles A. Brill; Frank D. Cimino

(57) ABSTRACT

A system includes a class D amplifier and a current steering digital-to-analog converter (DAC) directly connected to the class D amplifier. The system also includes a common mode servo circuit coupled to a node interconnecting the current steering DAC to the class D amplifier. The common servo circuit amplifies a difference between a common mode signal determined from the node and a reference voltage and generates a feedback current to the node based on the amplified difference. A feed-forward common-mode compensation circuit is included to reduce an alternating current (AC) ripple from the class D amplifier. The feed-forward common-mode compensation circuit includes first and second resistors coupled to respective outputs of the class D amplifier. A current mirror is coupled to the first and second resistors and is configured to sink a current from the node to ground that approximates a common mode feedback current of the class D amplifier.

13 Claims, 4 Drawing Sheets

Related U.S. Application Data continuation of application No. 15/395,290, filed on Dec. 30, 2016, now Pat. No. 9,930,452.

(60) Provisional application No. 62/363,084, filed on Jul. 15, 2016.

(51) Int. Cl.
| | | |
|---|---|---|
| *H03F 3/217* | (2006.01) | |
| *H03F 3/185* | (2006.01) | |
| *H03F 3/30* | (2006.01) | |
| *H03F 3/45* | (2006.01) | |

(52) U.S. Cl.
CPC ....... *H03F 3/3022* (2013.01); *H03F 3/45192* (2013.01); *H03F 2200/03* (2013.01); *H03F 2200/351* (2013.01); *H03F 2200/411* (2013.01); *H04R 3/00* (2013.01)

(58) Field of Classification Search
USPC ..... 381/94.8, 120, 28, 123; 330/251, 207 A, 330/51, 257, 288, 78, 75, 258, 9; 341/144
See application file for complete search history.

(56) References Cited

U.S. PATENT DOCUMENTS

| | | |
|---|---|---|
| 2009/0153251 A1 | 6/2009 | Cheng et al. |
| 2013/0259245 A1 | 10/2013 | Cheng et al. |
| 2013/0266158 A1 | 10/2013 | Elkhatib et al. |
| 2014/0247035 A1* | 9/2014 | Gupta ............... G05F 3/262 323/315 |
| 2015/0263676 A1 | 9/2015 | Lu et al. |

* cited by examiner

DIRECT CURRENT MODE DIGITAL-TO-ANALOG CONVERTER TO CLASS D AMPLIFIER

CROSS-REFERENCE TO RELATED APPLICATION(S)

This continuation application claims priority to U.S. patent application Ser. No. 15/897,177, filed Feb. 15, 2018, which claims priority to U.S. patent application Ser. No. 15/395,290, filed Dec. 30, 2016, which claims priority to and the benefit of U.S. Provisional Patent Application No. 62/363,084, filed Jul. 15, 2016, all of which are hereby incorporated herein by reference in their entirety.

BACKGROUND

The present subject matter relates generally to an audio amplifier. An amplifier is an electronic circuit that increases the voltage, current, or power of an input signal. Audio amplifiers are used in audio equipment of all kinds such as speakers, hearing aids, mobile phones, home theatre audio systems, etc. In some systems, a digital-to-analog converter (DAC) converts an input digital signal to an analog signal and provides the analog signal as the input signal to the amplifier. Cost, circuit noise and direct current (DC) offset can provide design challenges to the design of the amplifier.

SUMMARY

In accordance with at least one embodiment of the invention, a system includes a class D amplifier and a current steering digital-to-analog converter (DAC) directly connected to the class D amplifier. The system also includes a common mode servo circuit coupled to a node interconnecting the current steering DAC to the class D amplifier. The common servo circuit amplifies a difference between a common mode signal determined from the node and a reference voltage and generates a feedback current to the node based on the amplified difference. A feed-forward common-mode compensation circuit is included to reduce an alternating current (AC) ripple from the class D amplifier. The feed-forward common-mode compensation circuit includes first and second resistors coupled to respective outputs of the class D amplifier. A current mirror is coupled to the first and second resistors and is configured to sink a current from the node to ground that approximates a common mode feedback current of the class D amplifier.

In another embodiment, a system includes a class D amplifier and a DAC directly connected to the class D amplifier. The system also includes a common mode servo circuit coupled to a node interconnecting the current steering DAC to the class D amplifier. The common servo circuit amplifies a difference between a common mode signal determined from the node and a reference voltage and generates a feedback current to the node based on the amplified difference. A feed-forward common-mode compensation circuit is included to reduce an AC ripple from the class D amplifier. The feed-forward common-mode compensation circuit includes a current mirror configured to sink a current from the node to ground that approximates a common mode feedback current of the class D amplifier.

In yet another embodiment, a method includes converting a digital signal to an analog current by a DAC, providing the analog current directly from the DAC to a class D amplifier, and determining a common mode voltage from a node interconnecting the DAC and the class D amplifier. The method further includes amplifying a difference between the common mode voltage determined from the node and a common mode reference voltage to generate a feedback current, providing the feedback current to the node, generating a first current through from an output node of the class D amplifier that approximates a common mode AC current of the class D amplifier, and generating a second current through a current mirror from the node to a common potential that approximates the first current.

BRIEF DESCRIPTION OF THE DRAWINGS

For a detailed description of various examples, reference will now be made to the accompanying drawings in which.

DETAILED DESCRIPTION

In some electronic audio systems, a current-steering DAC converts an input digital signal to an output analog current. A current-to-voltage converter circuit then converts the DAC's output current to a voltage. The current-to-voltage converter circuit couples to a class D amplifier and the voltage output from the current-to-voltage converter circuit is converted back to a current through input resistors of the class D amplifier. Such architectures are particularly susceptible to noise as well as common mode ripple within the output stage (H-bridge) of the class D amplifier. The common mode ripple in turn necessitates a wide signal amplitude range for the amplifier's front-end which may preclude the use of low voltage power supplies.

In accordance with the disclosed embodiments, an audio system includes a current steering DAC that connects directly to a class D amplifier and thus without the current-to-voltage converter signal noted above. The disclosed system includes a common mode servo circuit which is coupled to a node interconnecting the current steering DAC to the class D amplifier. The common mode servo circuit may be configured to amplify a difference between a common mode signal determined from the node and a common mode reference voltage and generate a feedback current to the node based on the amplified difference. The common mode servo circuit reduces the common mode DC signal to the input of the class D amplifier.

The audio system also may include a feed-forward common-mode compensation circuit to reduce an AC ripple voltage from the class D amplifier. The feed-forward common-mode compensation circuit may include first and second resistors coupled to respective outputs of the class D amplifier. A current mirror also may be coupled to the first and second resistors and configured to sink a current (e.g., to ground) from the node interconnecting the DAC to the class D amplifier to approximate (e.g., within 10%) of a common mode feedback current of the class D amplifier. As such, any common mode ripple current through feedback resistors of the class D amplifier is provided an alternative path to ground instead of relying on the slower common mode service circuit to regulate the input stage of the class D amplifier. Consequently, the magnitude of the ripple voltage to the input stage of the class D amplifier will be smaller than without the feed-forward common-mode compensation circuit, alleviating design constraints on the audio system.

Figure 1:
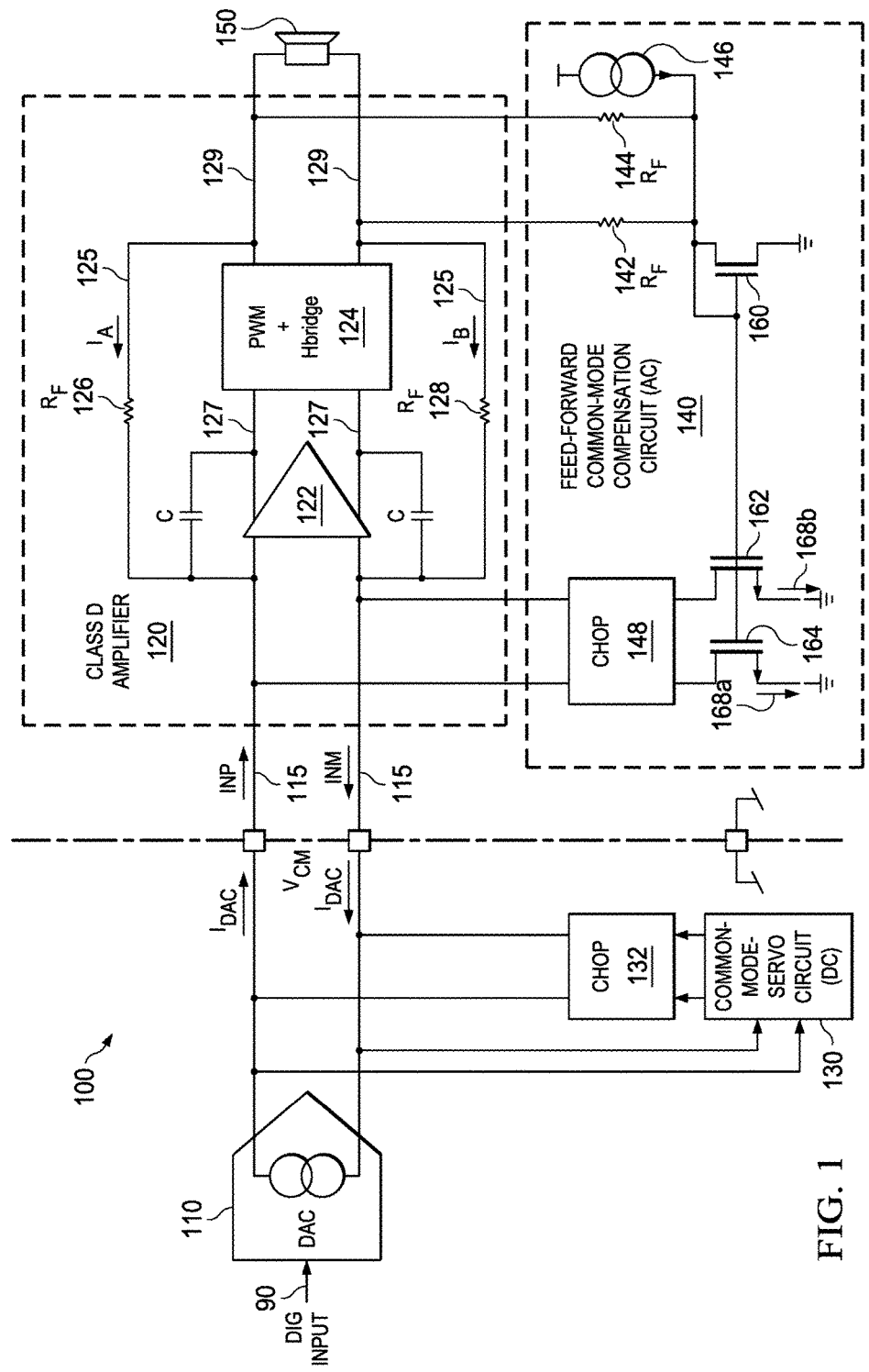
FIG. 1 shows a system in accordance with various examples.

FIG. 1 shows an embodiment of an audio system 100 comprising a current steering DAC 110, a class D amplifier 120, a common mode servo circuit 130, and a feed-forward common-mode compensation circuit 140. The audio system also may include, or be connected to, a speaker 150. The audio system 100 may be a standalone system or may be integrated within another device such as a computer, smart phone, hearing aid, home theatre audio system, etc.

A digital input bit stream 90 may be provided to the DAC 110. The DAC 110 may be a current-steering DAC, which converts the digital input to an analog output current ($I_{dac}$). The DAC 110 is connected directly to the class D amplifier and thus is not coupled to the class D amplifier through a current-to-voltage converter as might have been the case in other systems. The audio system 100 in this embodiment thus lacks a current-to-voltage converter. Node 115 refers to the node to which both the DAC 110 and the class D amplifier 120 connect. The voltages on the node conductors are designated as INP and INM as shown.

The class D amplifier 120 is an electronic amplifier in which the amplifying devices (e.g., transistors) operate as electronic switches, and not as linear gain devices as in other types of amplifiers. In the depicted embodiment, the amplifier 125 includes an error amplifier 122 and a pulse-width modulator (PWM) and H-bridge 124. Feedback resistors 126 and 128 also may be included to provide a feedback signal 125 from the output of the PWM and H-bridge 124 to the input of the error amplifier 122. Other components may be included as well such as an adder which may add the feedback signal to the input signal on node 115 and provide the summed signal to the input of the error amplifier 122.

The error amplifier 122 amplifies an error difference between the feedback output signal 125 and a summed audio input signal (which adds the input signal from node 115 to the feedback signal 125) to generate an amplified error signal 127. The amplified error signal 112 is provided to a PWM comparator within the PWM and H-bridge 124. The PWM comparator compares the amplified error signal 127 to a stable reference signal (e.g., a reference voltage or a ramp waveform) that may be generated by a ramp generator (not specifically shown) to generate a compensating error signal which is then provided to an H-bridge also implemented as part of the PWM and H-bridge 124. The H-bridge may include a pair of switches that reciprocally switch back and forth between fully conductive and nonconductive states. The compensating error signal causes the switches within the H-bridge to switch state to generate the feedback signal 125. The compensating error signal drives the feedback signal 125 (i.e., output voltage of the class D amplifier 120) closer to a desired level or strength. The feedback signal 125 may be provided back to an adder through the feedback resistors 126, 128 to be combined with input signal from node 115.

The audio system of FIG. 1 also includes chopping circuits 132 and 148. Each chopping circuit 132, 148 includes one or more switches that are toggled on and off at a certain rate and duty cycle so as to reduce flicker noise in the system. The clock used to toggles the switches on and off may be any suitable clock, such as a clock internal to the class D amplifier itself.

Figure 2:
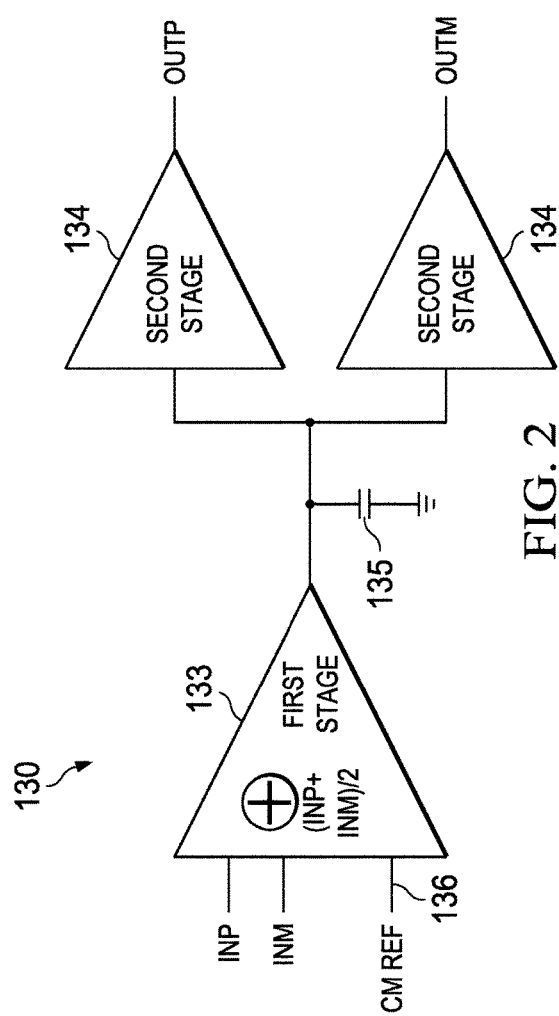
FIG. 2 shows an implementation of a common mode servo circuit of FIG. 1 in accordance with various examples.

The common mode servo circuit 130 reduces the DC common signal that may be present on node 115. FIG. 2 shows an example of an implementation of the common mode servo circuit 130. As shown, the common mode servo circuit 130 may include a first stage amplifier 133, second stage amplifiers 134, and a compensation capacitor 135. The first stage amplifier 133 determines the sum of the voltages INP and INM from node 115 and divides that summed voltage by 2 (i.e., (INP+INM)/2). The resulting voltage value is then compared to a common mode reference signal 136, which may be preconfigured to be the maximum desired level of the DC common signal. The output signal from the first stage amplifier 133 is then further amplified by the second stage amplifiers 134 to produce corresponding OUTP and OUTM output signals. These output signals cause feedback current to be injected back into node 115 through the chopping circuit 132. As a result of the feedback current injected back into node 115, the common mode voltage on node 115 is regulated to the level specified by the CM reference 136.

Figure 3:
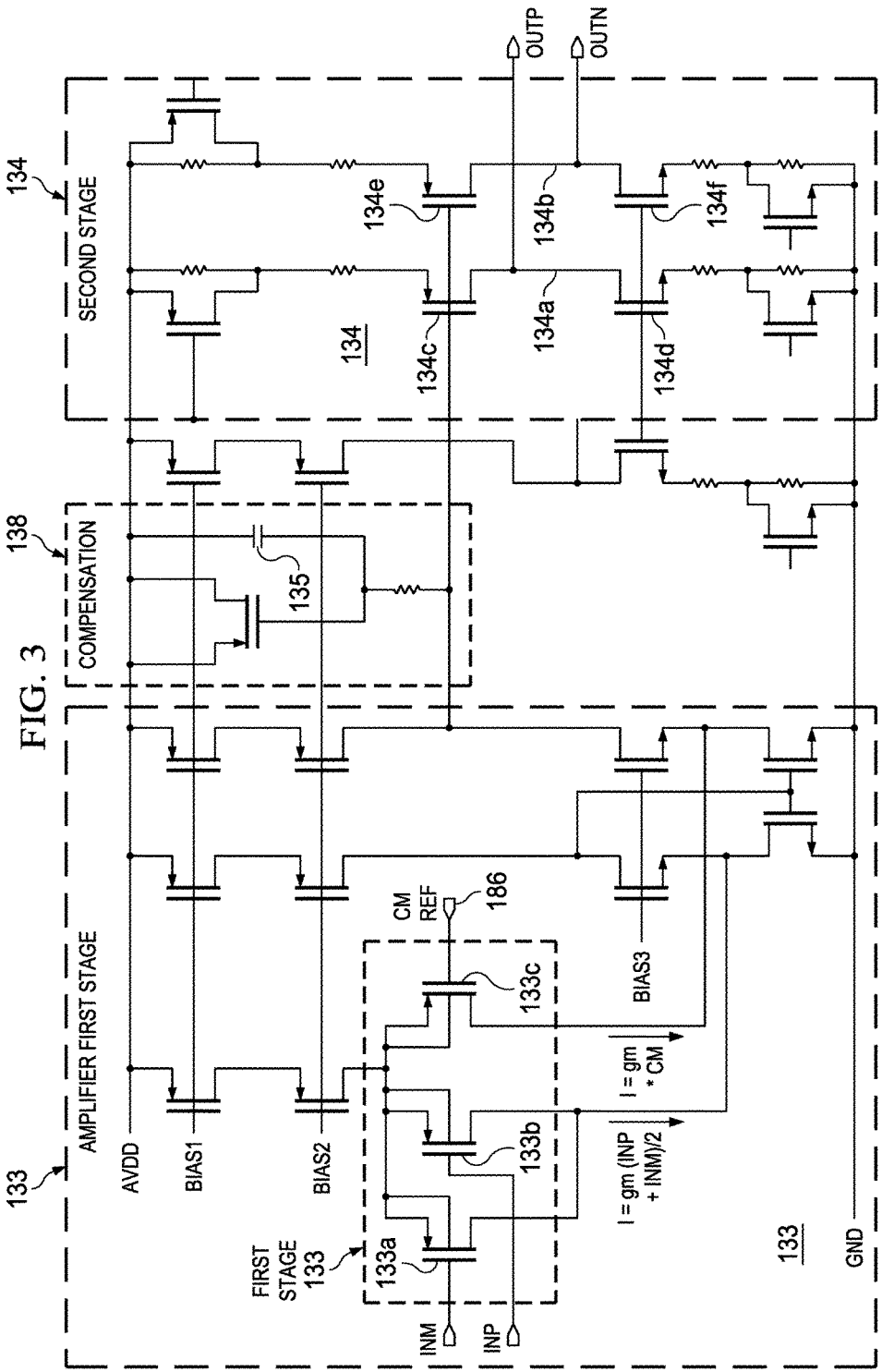
FIG. 3 shows additional implementation detail of the common mode servo circuit in accordance with various examples.

FIG. 3 illustrates a more detailed implementation of the common mode servo circuit 130 of FIG. 2. The circuit shown in the example of FIG. 3 includes a plurality of interconnected switches (e.g., transistors) as shown. The transistors that comprise the first stage 133 are shown as including transistors 133a, 133b, and 133c. Input voltages INM and INP are provided to the gates of transistors 133a and 133b, respectively. The CM reference signal 136 is provided to the gate of transistor 133c. The first stage of the CM servo circuit may be implemented as a folded cascade circuit with a single ended output. The output of the first stage may be an amplified error signal between CM reference and (INP+INM)/2. A compensation circuit 138 is included and the compensation circuit includes the compensation capacitor 135 noted above. The second stage of the amplifier may comprise a single class-A 0/P stage. Two identical Class-D A stages are included in the example of FIG. 3 to receive the output signal of the first stage. The two class-A output stages may generate a final output shown as OUTP and OUTM. The OUTP and OUTM output signals are generated from the nodes 134a and 134b, respectively. Node 134a interconnects the source of transistor 134c and the drain of transistor 134d, while node 134b interconnects the source of transistor 134e and the drain of transistor 134f.

Referring again to FIG. 1, the feed-forward common-mode compensation circuit includes resistors 142 and 144 that are connected to the output node 129 of the amplifier. Resistors 142 and 144 may comprise the same nominal resistance ($R_F$) as the feedback resistors 126 and 128. The feed-forward common-mode compensation circuit comprise a current mirror which may be implemented with transistors 160, 162, and 164. transistor 160 connects between resistors 142, 144 and a common potential (e.g., ground). transistor 162 is coupled between the node conductor comprising the voltage INM, via chopping circuit 148, and ground. transistor 165 is coupled between the node conductor comprising the voltage INP, via chopping circuit 148, and ground. The drain of transistor 160 is connected to the resistors 142, 144 and to the gates of all three transistors 160-164 of the current mirror.

The current through transistor 160 from drain to source is equal to OUTP+OUTM/($R_F$), which is the common mode AC current. This common mode current is divided by two and replicated, via operation of the current mirror, as currents 168a and 168b. The common current through feedback resistor 126 is designated as $I_A$, and the current through feedback resistor 126 is designated as $I_B$. The currents $I_A$ and $I_B$ are nearly equal to the currents 168a and 168b. As such, the common current is provided a path to ground through transistors 162, 164 of the current mirror instead of back through the error amplifier 122.

The feed-forward common-mode compensation circuit 140 also may include a current source 146. The current produced by the current source 146 may be hard-configured and is useful to maintain the feed-forward common mode compensation circuit in a suitable bias condition when both output voltages at node 129 are below a threshold. For example, the current source may generate current even when the output voltage from the amplifier is 0 V. If the output voltages of node 129 are both 0 V, then there would no current through resistors 142, 144 absent the current source 146. The hard-configured current generated by the current source 146 may be 10 μA (micro-amps), but can be other current levels as well.

Figure 4:
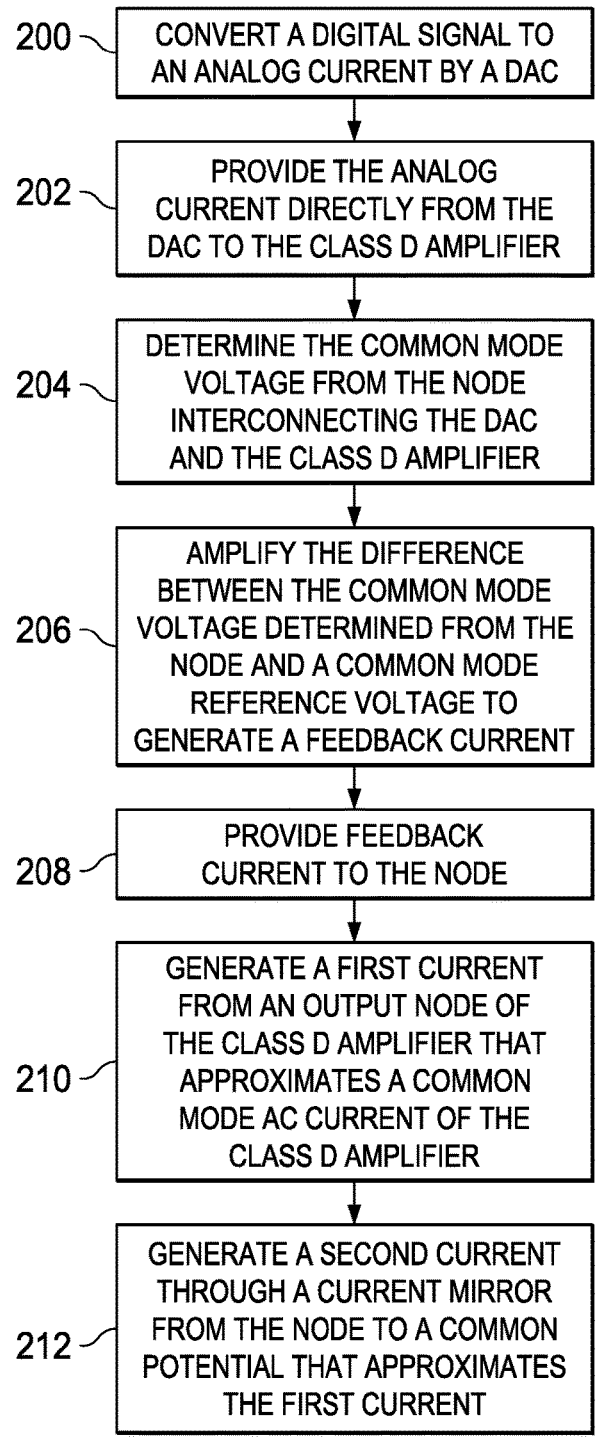
FIG. 4 shows a method in accordance with various examples.

FIG. 4 shows an example of a method in accordance with various embodiments. At 200, the method includes converting a digital signal to an analog current by a DAC. The DAC may be implemented as a current steering DAC as noted above, or as other types of DACs. At 202, the method includes providing the analog current directly from the DAC to an amplifier such as a class D amplifier.

At 204, the method includes determining a common mode voltage from a node interconnecting the DAC and the class D amplifier. In one embodiment, this operation may be implemented by summing voltages from the node interconnecting the DAC and the class D amplifier to produce a sum and injecting a current into the node based on the sum. The sum may be divided by 2 to produce an error signal, which then may be amplified to produce an output error signal. As noted below, a current may be injected back into the node based on the amplified output error signal.

At 206, the method may include amplifying a difference between the common mode voltage determined from the node and a common mode reference voltage to generate a feedback current. At 208, the feedback current is injected back into the node. A first current from the output node 129 of the class D amplifier may be generated (210) that approximates a common mode alternating current (AC) current of the class D amplifier. At 212, the method includes generating a second current through a current mirror from the node to a common potential that approximates (within 10%) the first current.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system for amplifying an analog current to produce an output audio signal, comprising:
   a class D amplifier;
   a current steering digital-to-analog converter (DAC) directly connected to the class D amplifier;
   a common mode servo circuit coupled to a node interconnecting the current steering DAC to the class D;
   a feed-forward common-mode compensation circuit, the feed-forward common-mode compensation circuit comprising:
      first and second resistors coupled to respective outputs of the class D amplifier; and
      a current mirror coupled to the first and second resistors and configured to sink a current from the node to ground that mirrors a common mode feedback current of the class D amplifier.

2. The system of claim 1, wherein the node includes first and second conductors, and wherein the common mode servo circuit comprises:
   a first stage amplifier that determines a sum, divided by 2, of signals from the first and second conductors, and amplifies a difference between the sum, divided by 2, and the reference voltage to generate an error signal; and
   a second stage amplifier configured to amplify the error signal.

3. The system of claim 2, wherein the error signal causes a current to be injected into the node to maintain the DC common signal on the node below the reference voltage.

4. The system of claim 1, further including a chopping circuit coupled between both the node and the common mode servo circuit as well as between the node and the feed-forward common-mode compensation circuit.

5. The system of claim 1, further comprising a current source coupled to the current mirror and configured to inject current through the current mirror responsive to an output voltage of the class D amplifier being below a threshold.

6. The system of claim 1, wherein the node includes first and second conductors, and wherein the current mirror comprises:
   a first transistor connected between the first and second resistors and ground;
   a second transistor coupled between the first conductor and ground; and
   a third transistor coupled between the second conductor and ground;
   wherein a drain of the first transistor is connected to the first and second resistors and gates of each of the first, second, and third transistors.

7. A system for amplifying an analog current to produce an output audio signal, comprising:
   a class D amplifier;
   a digital-to-analog converter (DAC) directly connected to the class D amplifier;
   a common mode servo circuit coupled to a node interconnecting the DAC to the class D amplifier; and
   a feed-forward common-mode compensation circuit, the feed-forward common-mode compensation circuit comprising a current mirror configured to sink a current from the node to ground that mirrors a common mode feedback current of the class D amplifier.

8. The system of claim 7, further comprising:
   first and second resistors coupled to respective outputs of the class D amplifier; and
   a current mirror coupled to the first and second resistors and configured to sink a current from the node to ground that mirrors the common mode feedback current.

9. The system of claim 7, wherein the DAC is a current steering DAC.

10. The system of claim 7, wherein the node includes first and second conductors, and wherein the common mode servo circuit comprises:
    a first stage amplifier that determines a sum, divided by 2, of signals from the first and second conductors, and amplifies a difference between the sum, divided by 2, and the reference voltage to generate an error signal; and
    a second stage amplifier configured to amplify the error signal.

11. The system of claim 7, further including a chopping circuit coupled between both the node and the common mode servo circuit as well as between the node and the feed-forward common-mode compensation circuit.

12. The system of claim 7, further comprising a current source coupled to the current mirror and configured to inject current through the current mirror responsive to an output voltage of the class D amplifier being below a threshold.

13. The system of claim 7, wherein the node includes first and second conductors, and wherein the current mirror comprises:
- a first transistor connected between the first and second resistors and ground;
- a second transistor coupled between the first conductor and ground; and
- a third transistor coupled between the second conductor and ground;
- wherein a drain of the first transistor is connected to the first and second resistors and gates of each of the first, second, and third transistors.

* * * * *